United States Patent [19]

Prinz et al.

[11] Patent Number: 4,823,177
[45] Date of Patent: Apr. 18, 1989

[54] METHOD AND DEVICE FOR MAGNETIZING THIN FILMS BY THE USE OF INJECTED SPIN POLARIZED CURRENT

[75] Inventors: Gary A. Prinz; James J. Krebs, both of Alexandria, Va.; Berend T. Jonker, Bowie, Md.

[73] Assignee: United States of America as represented by the Secretary of the Navy, Washington, D.C.

[21] Appl. No.: 213,862

[22] Filed: Jun. 30, 1988

[51] Int. Cl.$^4$ .............................................. H01L 41/06
[52] U.S. Cl. .................................................... 357/27
[58] Field of Search .......................................... 357/27

[56] References Cited

PUBLICATIONS

G. A. Prinz, "Growth of Single Crystal bcc α-Fe on ZnSe Via Molecular Beam Epitaxy", App. Phys. Letters, vol. 48, No. 25, pp. 1756–1758, 6/23/86.
J. Gintner, "Indirect Exchange Interaction via Electrons in Spin-Orbit Coupled Bands in Semiconductors", Phys. Stat. Sol. (b) vol. 96, pp. 735–744, 1979.
Publication, Interfacial Charge-Spin Coupling: Injection and Detection of Spin Magnetization in Metals, by M. Johnson et al., Physical Review Letters, vol. 55, No. 17, pp. 1790–1793.
Frequency-Dependent Faraday Rotation in CdMnTe by M. A. Butler et al., Appl. Phys. Lett 49 (17), pp. 1053–1055, 27 Oct. 1986.
MBE Growth of Single Crystal α-Fe Films on ZnSe (001) and (110), by B. T. Jonker et al., Journal of Crystal Growth 81, pp. 524–529, North-Holland, Amsterdam, 1987.
Molecular Beam Epitaxial Growth and Characterization of the Dilute Magnetic Semiconductor $Zn_{1-x}Fe_xSe$, by B. T. Jonker et al., Appl. Phys. Lett 50 (13), pp. 848–850, 30 Mar. 1987.
Magnetic Properties of Single-Crystal Fe Films Grown on ZnSe Epilayers by Molecular-Beam Epitaxy, by J. J. Krebs et al., J. Appl. Phys. 61 (8), pp. 3744–3746, 15 Apr. 1987.
Magnetic Properties of Single-Crystal Fe Films Grown on ZnSe Epilayers by Molecular-Beam Epitaxy, by J. J. Krebs et al., J. Appl. Phys. 61 (8), pp. 3744–3746, 15 Apr. 1987.
Se Passivation and Re–Growth On ZnSe and (Sn, Mn) Se(001) Epilayer Surfaces, by B. T. Jonker et al., eight page article (based on a presentation given to the 34th National Symposium and Topical Conference of the American Vacuum Society, Nov. 2–5, 1987) to be published by the American Institute of Physics Conference Proceedings in a book entitled "Depositions and Growth: Limits For Microelectronics".
Low-Temperature Magnetic Spectroscopy of a Dilute Magnetic Semiconductor, by D. D. Awschalom et al., Physical Review Letters, vol. 58, No. 8, pp. 812–815 23 Feb. 1987.
Boundary Resistance of the Ferromagnetic–Nonferromagnetic Metal Interface, by P. C. van Son et al., Physical Review Letters, vol. 58, No. 21, pp. 2271–2273 25 May 1987.
Dimensional–Crossover Studies of Magnetic Susceptibility In Diluted–Magnetic–Semiconductor Superlattices, by D. D. Awschalom et al., Physical Review Letters, vol. 59, No. 15, pp. 1733–1736, 12 Oct. 1987.
Dynamic Spin Organization In Dilute Magnetic Systems, by D. D. Awschalom et al., Physical Review Letters, vol. 55, No. 10, pp. 1128–1131, 2 Sept. 1985.

Primary Examiner—Eugene R. Laroche
Assistant Examiner—David Soltz
Attorney, Agent, or Firm—Thomas E. McDonnell; George Jameson

[57] ABSTRACT

A device and method for magnetizing a material having a magnetic constituent. In a preferred embodiment, a ferromagnetic film and a first film are selectively deposited at first and second locations on the material. The ferromagnetic film is magnetized in a first direction. A voltage source is coupled between the ferromagnetic and first films to enable a spin-polarized current to flow through the material to magnetize the material.

27 Claims, 2 Drawing Sheets

A further object of this invention is to magnetize a dilute magnetic semiconductor by means of an injected current of spin-polarized electrical carriers.

METHOD AND DEVICE FOR MAGNETIZING THIN FILMS BY THE USE OF INJECTED SPIN POLARIZED CURRENT

BACKGROUND OF THE INVENTION

The present invention relates to magnetizing dilute magnetic semiconductors, and particularly to magnetizing dilute magnetic semiconductors in either thin-film or bulk form, by means of an injected current of spin-polarized electrical carriers.

Dilute magnetic semiconductors (DMS) are a class of compounds formed by alloying a semiconductor (typically a IIB–VIB compound such as ZnSe or CdTe) with a transition metal (such as Cr, Mn, Fe, Co or Ni) substituted for the group IIB ion. The exchange coupling between the magnetic transition metal ion and the conduction carriers leads to dramatically enhanced magnetic phenomena, such as a large Faraday effect, large magneto-resistance and exciton g-factors of approximately 100. However, in order to realize these effects, the system of ions and carriers must possess a net magnetic polarization. A net magnetic polarization of a DMS material is typically achieved by magnetizing the DMS material.

Previous approaches to magnetizing a DMS material are based upon the application of a magnetic field to the DMS material. Basically, there are three prior art approaches to magnetizing a DMS material, as shown in prior art FIGS. 1–3.

FIG. 1 shows a system for performing a Faraday rotation experiment on a bulk dilute magnetic semiconductor (DMS) material 11 immersed in an external magnetic field (having a magnetic field direction H) to magnetize the DMS material 11. Light is changed to plane-polarized light by a polarizer 13 before that light propagates in a direction parallel to the magnetic field direction H through the magnetized DMS material 11 to produce a Faraday effect. Thus, as the plane-polarized light passes through the DMS material 11, the plane of polarization of the light is rotated by an angle of rotation proportional to the Verdet constant of the DMS material 11, the amount of magnetization of the DMS material 11 and the optical path length through the DMS material 11. The amount that the plane of polarization of light is rotated is then used to measure the magnetization of the DMS material 11.

In FIG. 1 the external magnetic field applied to the DMS material 11 is shown as being applied by a solenoid 15, which is powered by a voltage source 17. However, such an external magnetic field could also be provided by an electromagnet, a superconducting magnet or a permanent magnet.

FIG. 2 shows another system for generating the Faraday effect in a DMS material. In this system, a bulk DMS material 19 is sandwiched between a ground plane 21 and a strip line 23 of a strip line configuration. Radio frequency (RF) current from an RF source 25 flows through a coaxial cable 27 and down the strip line 23. The RF current, which is relatively large in amplitude, propagates down the strip line 23 in the direction K polarized such that the h or magnetic field vector of the RF current is perpendicular to the DMS material 19. As a result, this large RF current flowing through the strip line magnetizes the DMS material 19.

Light from a laser 29 is then propagated through a polarizer 31 to cause the light to become plane-polarized. This plane-polarized light from the polarizer 31 passes through the magnetized DMS material 19 parallel to the h vector which causes its plane of polarization to be rotated. An analyzer 33 intercepts the light from the DMS material 19 to measure the angle through which the plane of polarization of the light has been rotated. The amount of rotation of the plane of polarization is then used to measure the magnetization of the DMS material.

The system of FIG. 2 is described more fully in the article "Frequency-dependent Faraday Rotation in CdMnTe", by M. A. Butler et al., Appl. Phys. Lett., Vol. 49 (17), pp. 1053–1055, Oct. 27, 1986.

In each of the systems of FIGS. 1 and 2, the amount of rotation of the plane of polarization of light passed through a magnetized DMS material is used to measure the magnitude of the magnetization in that DMS material. Furthermore, in each of the systems of FIGS. 1 and 2 an external magnetic field is required to magnetize the DMS material. In the system of FIG. 1, that external magnetic field can be developed by a solenoid, an electromagnet, a superconducting magnet or a permanent magnet. On the other hand, in the system of FIG. 2 that external magnetic field results from the flow of RF current through a strip line.

FIG. 3 shows a system in which a DMS material 37 is not magnetized by an external field, but rather by an incident laser beam with either a right- or left-handed circular polarization. Thus, there is a photo-induced magnetization of the DMS material 37. More specifically, linearly polarized light from a laser 39 is propagated through a quarter wave plate 41 to develop circularly polarized light with either a right- or left-handed circular polarization. This circularly polarized light passes through a pickup loop 43 of a SQUID (superconducting quantum interference device) magnetometer 45 and is incident to the DMS material 37 in the direction normal to the plane of the SQUID pickup loop 43. The circularly polarized light excites carriers in the DMS material 37 of predominately one spin state -either spin up or spin down. As a result, the DMS material 37 becomes spin-polarized or magnetized. The SQUID magnetometer 45 is used to detect the net magnetic moment (or degree of magnetization) induced in DMS material 37 by the incident circularly polarized light.

The system of FIG. 3 is described more fully in the article "Low-Temperature Magnetic Spectroscopy of a Dilute Magnetic Semiconductor", by D. D. Awschalom et al., Physical Review Letters, Vol. 58, No. 8, pp. 812–815, Feb. 23, 1987.

It should be noted that the system of FIG. 3 requires a separate laser 39 and a quarter wave plate 41 to magnetize the DMS material 37.

OBJECTS OF THE INVENTION

Accordingly, one object of the invention is to magnetize a material having a magnetic constituent by means of an injected spin-polarized current.

Another object of this invention is to provide a simple, compact, inexpensive, improved device for magnetizing a material having a magnetic constituent.

A further object of this invention is to magnetize a dilute magnetic semiconductor by means of an injected current of spin-polarized electrical carriers.

SUMMARY OF THE INVENTION

These and other objects of the invention are achieved by providing a device, and a method therefor, for magnetizing a material having a magnetic constitutent by means of an injected current of spin-polarized electrical carriers, wherein the device includes a ferromagnetic film disposed at a first location on the material, a conductive first film disposed at a second location on the material, and means for accepting a voltage between the ferromagnetic and first films to enable a spin-polarized current to flow through the material to magnetize the material.

BRIEF DESCRIPTION OF THE DRAWINGS

These and other objects, features and advantages of the invention, as well as the invention itself, will become better understood by reference to the following detailed description when considered in connection with the accompanying drawings wherein like reference numerals designate identical or corresponding parts throughout the several views, and wherein.

DETAILED DESCRIPTION OF THE PREFERRED EMBODIMENT

Figure 1:
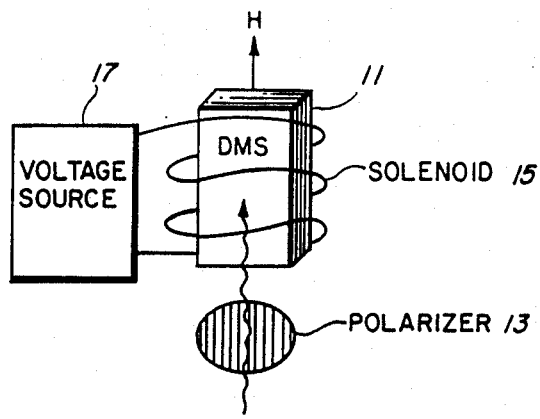
FIGS. 1-3 are schematic diagrams of various prior art techniques for magnetizing dilute magnetic semiconductor materials.
Figure 2:
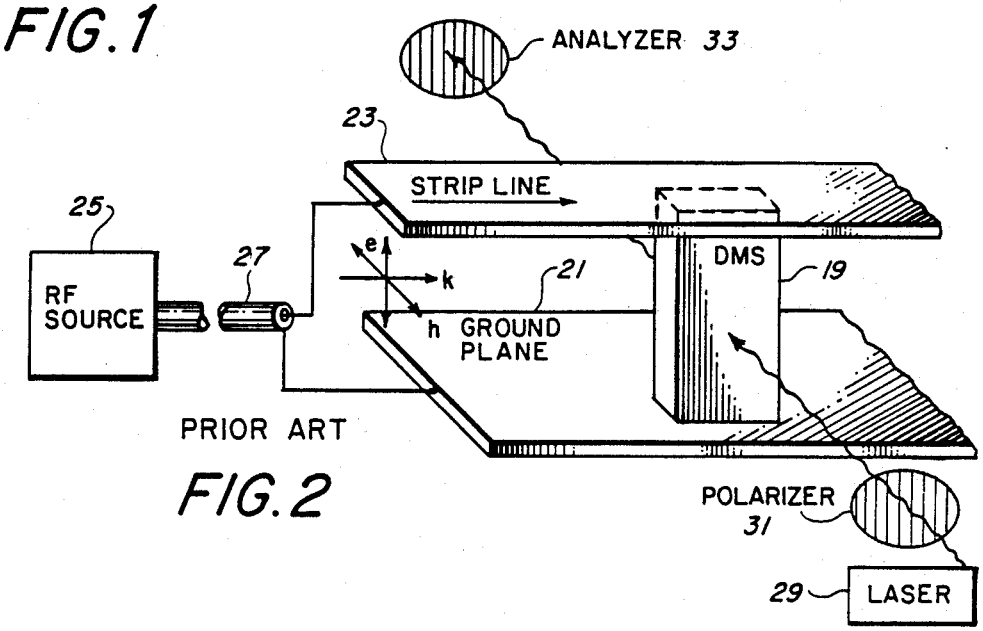
Figure 3:
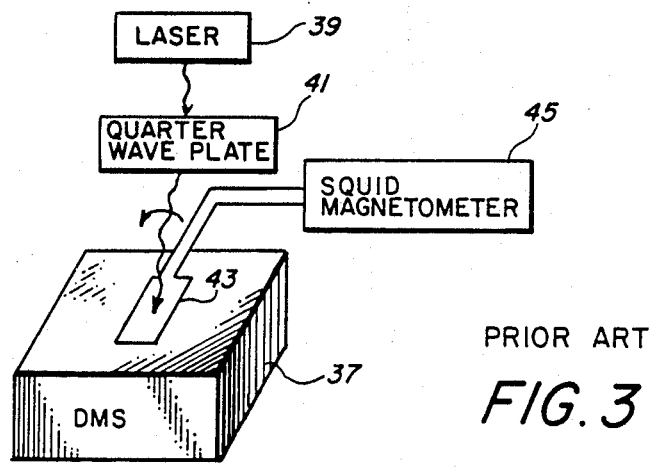
Figure 4:
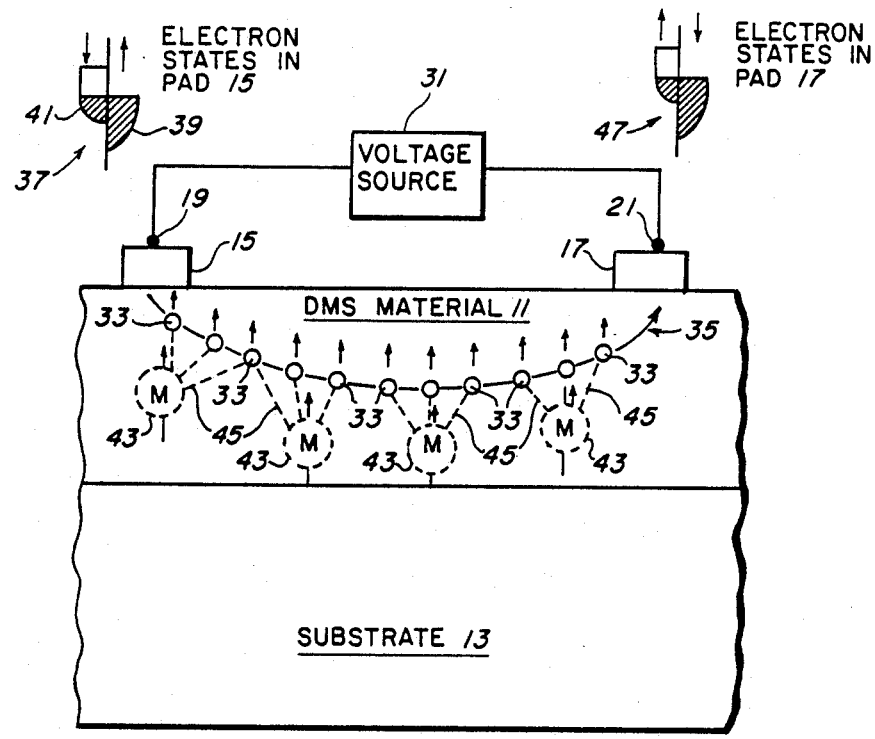
FIG. 4 is a sectional side view of the device of the invention.

Referring now to FIG. 4, a sectional side view of the device of the invention is shown. In one embodiment of the invention, a thin film of a suitable dilute magnetic semiconductor (DMS) material 11 is deposited upon a suitable substrate 13.

The substrate 13 may be any suitable semiconductor substrate, such as gallium arsenide (GaAs). It may have any suitable size and thickness. Typically, by current industry standards, it can be a 3-inch diameter wafer with a thickness of 20 thousandth of an inch.

The DMS material 11 is a alloy in which atoms of a group IIB element of a group IIB–group VIB compound semiconductor (such as ZnSe, CdTe or ZnTe) are replaced by ions of one or more transition metals (such as Cr, Mn, Fe, Co or Ni). Typically, the DMS material 11 contains manganese to form an alloy such as $Cd_{1-x}Mn_xTe$, $Zn_{1-x}Mn_xSe$ or $Zn_{1-x}Mn_xTe$, where the value of x determines the concentration of the associated element. In a recent development, an Fe-based DMS material has been grown on a GaAs substrate by molecular beam epitaxy to form the alloy $Zn_{1-x}Fe_xSe$, as described in the article "Molecular beam epitaxial growth and characterization of the dilute magnetic semiconductor $Zn_{1-x}Fe_xSe$", by B. T. Jonker et al., Appl. Phys. Lett. 50 (13), pp. 848-850, Mar. 30, 1987.

The DMS material 11 may be selectively deposited to an exemplary 1 micron thickness over an exemplary 10 micron by 10 micron area on the substrate 13 by any of several conventional deposition techniques, such as molecular beam epitaxy, liquid phase epitaxy and chemical vapor deposition. An exemplary process for growing the DMS material $Zn_{1-x}Fe_xSe$ on a GaAs substrate is described in the above-noted article by B. T. Jonker et al.

It should be noted at this point that, if the DMS material 11 were made thick enough to be self-supporting, the substrate 13 would not be necessary and could be eliminated. This is particularly true when the DMS material 11 is in a bulk form.

Injection and collection pads 15 and 17, respectively, are then selectively grown at preselected positions on the DMS material 11. Both of the pads 15 and 17 are conductive and are preferrably metallic. In one implementation of the invention, each of the pads 15 and 17 is comprised of a suitable ferromagnetic conducting film, such as iron. The ferromagnetic pads 15 and 17 can either be deposited through a mask (not shown) or a standard lithographical technique can be used after the ferromagnetic film has been deposited on the DMS material 11 to leave the pads 15 and 17 in any configuration or location desired. A method for depositing such a pad on a semiconductor surface utilizing MBE is described in the article "Growth of Single Crystal bcc $\alpha$-Fe on ZnSe via Molecular Beam Epitaxy", by G. A. Prinz et al., Phys. Lett. 48 (25), pp. 1756-1758, Jun. 23, 1986. An etching technique for such a lithographical technique could use hydrochloric acid, sulfuric acid or standard plasma etching to remove any superfluous ferromagnetic film outside of the desired pattern for the pads 15 and 17. The rate for an acid etching is approximately one micron per minute. A subsequent rinse in distilled water removes the acid and etched-away portions without any damage to the DMS material 11.

Electrical contacts 19 and 21 are respectively disposed on the pads 15 and 17. These contacts 19 and 21 can be directly soldered to the pads 15 and 17 using, for example, indium solder. Alternatively, the contacts 19 and 21 can be in the form of gold pads deposited on the pads 15 and 17.

The ferromagnetic injection pad 15 is the source of spin-polarized carriers. To enable the pad 15 to operate as the source of spin-polarized carriers, the ferromagnetic pad 15 must be initially magnetized in a first direction. To understand how the pad 15 is initially magnetized, FIG. 5 will now be discussed.

Figure 5:
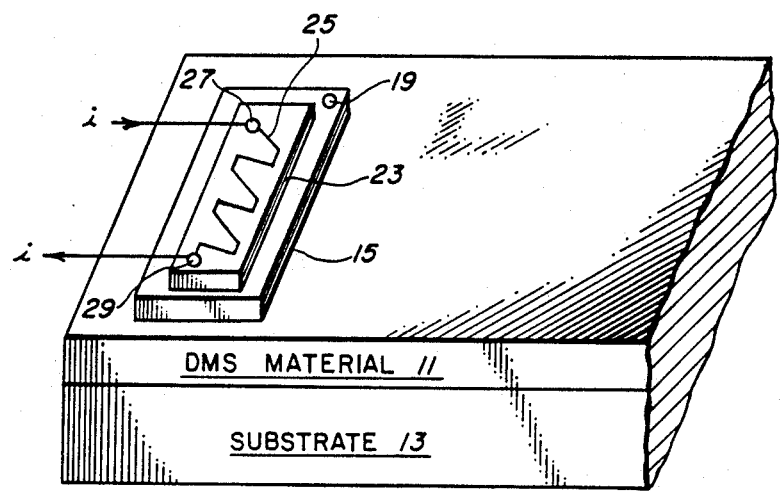
FIG. 5 is a perspective side view of the device of the invention showing meander lines.

FIG. 5 is a perspective side view of the device of the invention, which illustrates one way in which the pad 15 can be initially magnetized in a first direction. After the pad 15 has been deposited on the DMS material 11, an insulator layer 23 of, for example, silicon dioxide ($SiO_2$) is placed on a portion of the pad 15. Then a final metallic layer in the form of a meander line 25 is lithographically placed on a portion of the insulator layer 23. The meander line 25 is a zig-zag overlay which has terminals 27 and 29 at opposite ends.

When a direct current source (not shown) is connected to the terminals 27 and 29, current flows through the meander line 25, causing a magnetic field to be generated around the meander line 25. This current is insulated from the pad 15 by the $SiO_2$ insulating layer 23. However, the magnetic field generated by the meander line 25 penetrates the pad 15 beneath it and magnetizes the pad 15 in a first direction determined by the direction of current flow through the meander line 25. The pad 15 will remain magnetized in this first direction. However, if current is passed through the meander line 25 in the opposite direction, the pad 15 will become magnetized in the opposite or second direction.

An insulating $SiO_2$ layer and meander line (not shown), similar to the $SiO_2$ layer 23 and meander line 25 on the pad 15, are similarly placed on the ferromagnetic pad 17 (FIG. 4), and current passed through the associated meander line on the pad 17 in a direction opposite from the direction in which current flowed through the meander line 25. As a result, the ferromagnetic pads 15 and 17 are magnetized in opposite directions.

In an alternative arrangement the collection pad 17 can be comprised of a non-magnetic material, such as gold, silver, aluminum or copper. In this case, no insulating SiO$_2$ layer or meander line is needed on the non-magnetic collection pad 17. The pad 15 can then be magnetized in a given direction by temporarily exposing the device of the invention to a magnetic field. Such a magnetic field would have no effect on the non-magnetic pad 17.

Referring back to FIG. 4, a voltage source 31 is shown coupled between the pads 15 and 17 by way of the respective contacts 19 and 21. The voltage source 31 can be a DC, AC or modulated voltage source. At this time, assume that the voltage source 31 is a DC source, such as a battery. As a consequence, carriers (electrons or holes) flow, for example, from the source 31 through the ferromagnetic injection pad 15, along a path 35 through the DMS material 11, and through the pad 17 back to the source 31. However, for purposes of this discussion, the carriers will be electrons.

It should be noted at this time that a ferromagnetic material, such as the injection pad 15, is characterized by a magnetic moment which relates to the ratio of spin-up electrons to spin-down electrons. Each electron has a moment which either points up or down. In a ferromagnetic material there are more electrons with moments that point up than electrons with moments that point down. This is illustrated in insert 37 which represents the electron states in the ferromagnetic pad 15, with the larger area 39 representative of the relative number of spin-up electrons passing down through the pad 15 and the smaller area 41 representative of the relative number of spin-down electrons passing down through the pad 15.

The spin-up electrons passing through the pad 15 are called majority spin electrons, while the spin-down electrons pasing through the pad 15 are called minority spin electrons. As a result, a current flowing through the ferromagnetic injection pad 15 will reflect the magnetization of that ferromagnetic pad 15. That is, the current flowing along the path 35 through the DMS material 11 will consist of more spin-up electrons than spin-down electrons. This is the key reason why the ferromagnetic pad 15 is the source of spin-polarized electrons.

Since it is the unequal population of spin-up versus spin-down electrons in the ferromagnetic pad 15 (as shown in insert 37) that gives rise to the net moment of the pad 15, a current emitted from the ferromagnetic pad 15 will possess a net polarized spin density. This net polarized spin density will cause, by way of an exchange interaction or exchange coupling force to the substitutional magnetic ions in the DMS material 11, a net polarization of the DMS material 11.

The magnitude of the net polarization of the DMS material 11 can be estimated. The number of polarized spins is given by the equation:

$$N_s = N_e/Sec \times \tau_{pol} \times N_p \times (\%pol)$$

where:

$N_e/Sec$ = the magnitude of the injection electric current.

$\tau_{pol}$ = the spin relaxation rate of the carriers.

$N_p$ = the number of ions polarized per polarized carrier.

$(\%pol)$ = the percentage of injected carriers polarized.

Assuming a uniform current of 1 ma [$N_e = (10^{16}/1.6)$ electrons/sec] across a volume of 10 micron $\times$ 10 micron $\times$ 1 micron, $\tau_{pol} \approx 10^{-6}$ sec (for $<10\%$ magnetic ion concentration), $N_p = 25$ ions/electron, (% pol) = 22% (Stoner estimate for Fe), and substituting these values in the above equation:

$$N_s = (10^{16}/1.6)10^{-6} (25) (0.22) = 3 \times 10^{10}$$

Since the estimated volume contains $10^{11}$ magnetic ions, this estimate $\approx 30\%$ magnetic polarization of the conducting region of the DMS material 11.

For the sake of simplicity, all of the electrons 33 along the path 35 are ideally shown as spin-up electrons. However, it should be understood that a relatively small number of spin-down electrons also move along the path 35.

The spin-up electrons 33 act to similarly align the magnetic moment of the magnetic ions 43 in the DMS material 11 by way of an exchange coupling force, represented by dashed lines 45, between the magnetic ions 43 and electrons 33. More than one electron 33 may be coupled to each magnetic ion 43 at a given time. In addition, a given electron 33 may be coupled to more than one magnetic ion at a given time.

If the collection pad 17 is made of a non-magnetic material, such as gold, silver, aluminum, and indium or any alloy therof, the pad 17 would have no magnetic effect on the electrons passing therethrough. On the other hand if the collection pad 17 is also a ferromagnetic pad, it would have to be magnetized in the opposite direction from that of the ferromagnetic pad 15, as discussed before. Since the pad 17 would be magnetized in an opposite direction from that of the pad 15, there would be more empty electron states available to accept electrons with moments that point up than electrons with moments that point down. This is illustrated in insert 47 which represents these electron states in the ferromagnetic pad 17.

The device of FIG. 4 can also be utilized as an AC operating device by utilizing an AC or modulated signal source 31, which would produce an AC spin-polarized current flowing through the DMS material 11. The device of FIG. 4 is a very fast responding device which can operate on the order of $10^{10}$ Hertz. Thus, the AC current from the source 31 could have a frequency in the gigahertz range.

A further manifestation of the idea of spin-polarized transport is to replace the DMS material 11 with a material which has a magnetic constituent. A material having a magnetic constituent could be selected from the group consisting of iron, cobalt, nickel, ruthenium, rhodium, palladium, osmium, iridium and platinum and any alloy thereof, which elements are well known to exhibit ferromagnetism if implanted with magnetic impurities. In this particular case the implantation would be spin-polarized carriers. Thus, the spin-polarized carriers from the ferromagnetic pad 15 would be injected into, for example, the palladium, and with a sufficient magnitude of current the palladium would become ferromagnetic.

The above-described device offers several advantages and new features. No magnetic fields are needed during the operation of the device. The device is purely electronic, i.e. depends only upon its own electrical transport properties. If consumes little power, is very compact and can be completely fabricated using known thin-film device technology. Furthermore, the sense of magnetization can be reversed merely by reversing the direction of the current flow between the two pads 15 and 17. Since the speed of oepration is purely limited by the transport velocity of the polarized carriers and the response time of the transition metal spin system, it should be capable of switching speeds approaching $10^{10}$ sec$^{-1}$. This is $10^6$ times faster than an inductive solenoidal circuit capable of producing only $\approx 10^2$ Oe, which in turn is capable of only 1% magnetic polarization.

Therefore, what has been described is a method and device which utilizes a spin-polarized current injected into a DMS material 11 to polarize the magnetic ion spin system in the DMS material 11 through the exchange interaction between magnetic ions in the material and the injected spin-polarized current passing through the DMS material 11. The magnetized DMS material 11 can be used for a number of applications including: magneto-optical devices (Faraday effect or Kerr effect), magneto-transport devices (Hall effect or magneto-resistance) or others which exploit properties of DMS materials when they are magnetically polarized.

It should therefore readily be understood that many modifications and variations of the present invention are possible within the purview of the claimed invention. It is therefore to be understood that, within the scope of the appended claims, the invention may be practiced otherwise than as specifically described.

What is claimed and desired to be secured by letters patent of the United States is:

1. A device comprising:
   a material having a magnetic constituent;
   a ferromagnetic film disposed at a first location on said material, said ferromagnetic film being magnetized in a first direction;
   a conductive first film disposed at a second location on said material; and
   means for accepting a voltage between said ferromagnetic and first films to enable a spin-polarized current to flow through said material to magnetize said material.
2. The device of claim 1 wherein:
   said first film comprises a second ferromagnetic film magnetized in a second direction.
3. The device of claim 2 wherein:
   said material is comprised of a dilute magnetic semiconductor material.
4. The device of claim 2 wherein:
   said material includes magnetic impurities.
5. The device of claim 4 wherein:
   said material is selected from the group consisting of iron, cobalt, nickel, ruthenium, rhodium, palladium, osmium, iridium and platinum and any alloy therof.
6. The device of claim 1 wherein:
   said first film is comprised of a non-magnetic metal.
7. The device of claim 6 wherein:
   said first film is selected from the group consisting of gold, silver, aluminum, copper and indium and any alloy thereof.
8. The device of claim 6 wherein:
   said material is comprised of a dilute magnetic semiconductor material.
9. The device of claim 6 whereiñ:
   said material includes magnetic impurities.
10. The device of claim 9 wherein:
    said material is selected from the group consisting of iron, cobalt, nickel, ruthenium, rhodium, palladium, osmium, iridium and platinum and any alloy thereof.
11. The device of claim 1 further including:
    a substrate, and wherein said material is in the form of a film deposited upon said substrate.
12. The device of claim 11 wherein;
    said substrate is a semiconductor subśtrate.
13. The device of claim 12 wherein:
    said first film comprises a second ferromagnetic film magnetized in a second direction.
14. The device of claim 13 wherein:
    said material is comprised of a dilute magnetic semiconductor material.
15. The device of claim 13 wherein:
    said material includes magnetic impurities.
16. The device of claim 15 wherein:
    said material is selected from the group consisting of iron, cobalt, nickel, ruthenium, rhodium, palladium, osmium, iridium and platinum and any alloy therof.
17. The device of claim 12 wherein:
    said first film is comprised of a non-magnetic metal.
18. The device of claim 17 wherein:
    said first film is selected from the group consisting of gold, silver, aluminum, copper and indium and any alloy therof.
19. The device of claim 17 wherein:
    said material is comprised of a dilute magnetic semiconductor material.
20. The device of claim 17 wherein:
    said material includes magnetic impurities.
21. The device of claim 20 wherein:
    said material is selected from the group consisting of iron, cobalt, nickel, ruthenium, rhodium, palladium, osmium, iridium and platinum and any alloy thereof.
22. A method for magnetizing a material having a magnetic constituent, said method comprising the steps of:
    depositing a ferromagnetic film at a first location on the material;
    depositing a conductive first film at a second location on the material;
    magnetizing the ferromagnetic film in a first direction; and
    applying a voltage across the ferromagnetic and first films to enable a spin-polarized current to flow through the material to magnetize the material.
23. The method of claim 22 including before the depositing a ferromagnetic film step the further step of:
    depositing the material in the form of a film on a preselected substrate.
24. The method of claim 22 wherein said depositing a conductive first film step includes the steps of:
    selecting a first film comprised of a ferromagnetic material;
    depositing the ferromagnetic first film at the second location; and
    magnetizing the ferromagnetic first film in a second direction.
25. A method for magnetizing a dilute magnetic semiconductor material, said method comprising the steps of:
    depositing a ferromagnetic film at a first location of the dilute magnetic semiconductor material;
    depositing a metallic first film at a second location of the dilute magnetic semiconductor material;

magnetizing the ferromagnetic film in a first direction; and applying a voltage across the ferromagnetic and first films to enable a spin-polarized current to flow through the dilute magnetic semiconductor material to magnetize the dilute magnetic semiconductor material.

26. The method of claim 25 wherein said depositing a metallic first film step includes the steps of:

depositing a first film of ferromagnetic material at the second location; and magnetizing the first film in a second direction.

27. The method of claim 25 wherein said depositing a metallic first film step includes the step of:

selecting a non-ferromagnetic material as the first film; and depositing a first film of non-ferromagnetic material at the second location.

* * * * *